(12) United States Patent
Seo

(10) Patent No.: US 6,181,559 B1
(45) Date of Patent: Jan. 30, 2001

(54) DEVICE FOR ATTACHING A HEAT SINK

(75) Inventor: Yeol-Gu Seo, Suwon (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/358,586

(22) Filed: Jul. 21, 1999

(30) Foreign Application Priority Data

Jul. 21, 1998 (KR) .................................................. 98-29201

(51) Int. Cl.[7] .................................................... H05K 7/20
(52) U.S. Cl. ........................ 361/704; 361/703; 361/714; 361/717; 361/719; 257/718; 257/719; 257/727; 174/16.3; 165/80.3; 24/294; 24/458
(58) Field of Search .................................... 361/704, 707, 361/709, 710, 715, 719–721; 165/80.2, 80.3, 80.4, 185; 174/16.3; 257/706, 707, 712, 713, 718–722, 727; 24/293–296, 458

(56) References Cited

U.S. PATENT DOCUMENTS

| | | |
|---|---|---|
| 5,381,041 | 1/1995 | Harmon . |
| 5,396,402 | 3/1995 | Perugini et al. . |
| 5,430,610 | 7/1995 | Hung . |
| 5,495,392 | 2/1996 | Shen . |
| 5,521,439 | 5/1996 | Casati et al. . |
| 5,600,540 * | 2/1997 | Blomquist ............................ 361/704 |
| 5,611,393 | 3/1997 | Vasconcelos et al. . |
| 5,638,258 | 6/1997 | Lin . |
| 5,640,305 | 6/1997 | Smithers . |
| 5,661,639 | 8/1997 | Furuno et al. . |
| 5,771,960 * | 6/1998 | Lin ..................................... 165/80.3 |
| 5,791,403 | 8/1998 | Chiou . |
| 5,828,553 * | 10/1998 | Chiou .................................. 361/704 |
| 5,847,928 * | 12/1998 | Hinshaw et al. ..................... 361/704 |
| 5,883,782 | 3/1999 | Thurston et al. . |
| 5,898,571 | 4/1999 | Mertol . |
| 5,933,326 * | 8/1999 | Lee et al. ............................. 361/704 |
| 6,061,239 * | 5/2000 | Blomquist ........................... 361/704 |

\* cited by examiner

Primary Examiner—Leo P. Picard
Assistant Examiner—Boris L. Chervinsky
(74) Attorney, Agent, or Firm—Robert E. Bushnell, Esq.

(57) ABSTRACT

A device for attaching a heat sink having a first and a second surface to an element generating heat in an electronic system, which element has an upper plane side contacting the first surface of the heat sink and a lower connector side connected to a printed circuit board, comprises a pair of holes formed on the upper plane side of the element at both sides of the heat sink attached to the element, a clip attached to the second surface of the heat sink having two hooked ends respectively connected with the pair of holes, a lever hinged to the clip, and a support hinged to the lever, wherein the lever is swung so as to cause the support to press or release the heat sink against or from the element. Preferably, the clip has a lever holding seat to hold a first fixing lug formed on the lever swung to cause the support to press the heat sink, thereby preventing the lever from inadvertent reverse swing. In addition, the clip may have a stopper to limit the swing of the lever for releasing the heat sink from the element, and the lever has additionally a second fixing lug resiliently fixed onto the lever swung to release the heat sink from the element.

20 Claims, 8 Drawing Sheets

DEVICE FOR ATTACHING A HEAT SINK

CLAIM OF PRIORITY

This application makes reference to, incorporates the same herein, and claims all benefits accruing under 35 U.S.C. §119 from an application entitled *ATTACHING APPARATUS FOR HEAT SINK* earlier filed in the Korean Industrial Property Office on Jul. 21, 1999, and there duly assigned Serial No. P98-29201, a copy of which is annexed hereto.

BACKGROUND OF THE INVENTION

1. Technical Field

The present invention concerns a device for attaching a heat sink, and more particularly to a device for attaching a heat sink to an electronic unit generating heat such as central processing unit of a computer.

2. Related Art

Technological development has significantly reduced the sizes of computer systems with increasing their capacities, so that various electronic devices including semiconductor devices may be packaged into a single semiconductor module. For example, a high speed central processing unit is usually achieved by packaging a cache memory and processor. The heat sink is to absorb or dissipate the heat generated during the operation of such a semiconductor module.

I have found that inefficient methods and devices for attaching a heat sink to a heat producing unit can be extremely inconvenient. Efforts have been made to improve heat sinks and securing means for heat sinks.

Exemplars of recent efforts in the art include U.S. Pat. No. 5,611,393 for *CLAMPING HEAT SINK* issued to Vasconcelos, et al., U.S. Pat. No. 5,638,258 for *CPU HEAT SINK FASTENER* issued to Lin, U.S. Pat. No. 5,640,305 for *ANCHOR FOR SECURING HEAT SINK TO A PRINTED CIRCUIT BOARD* issued to Smithers, U.S. Pat. No. 5,661,639 for *STRUCTURE FOR ATTACHING A HEAT SINK TO A SEMICONDUCTOR DEVICE* issued to Furuno, et al., U.S. Pat. No. 5,791,403 for *CLAMPING DEVICE ADAPTED FOR SECURING A HEAT SINK TO A CPU MOUNT TO HOLD DOWN A CPU* issued to Chiou, U.S. Pat. No. 5,883,782 for *APPARATUS FOR ATTACHING A HEAT SINK TO A PCB MOUNTED SEMICONDUCTOR PACKAGE* issued to Thurston, et al., U.S. Pat. No. P5,396,402 for *APPLIANCE FOR ATTACHING HEAT SINK TO PIN GRID ARRAY AND SOCKET* issued to Perugini, et al., U.S. Pat. No. 5,381,041 for *SELF CLAMPING HEAT SINK* issued to Hannon, U.S. Pat. No. P5,521,439 for *COMBINATION AND METHOD FOR COUPLING A HEAT SINK TO A SEMICONDUCTOR DEVICE* issued to Casati, et al., U.S. Pat. No. 5,495,392 for *CPU HEAT DISSIPATING APPARATUS* issued to Shen, U.S. Pat. No. 5,898,571 for *APPARATUS AND METHOD FOR CLIP-ON ATTACHMENT OF HEAT SINKS TO ENCAPSULATED SEMICONDUCTOR PACKAGES* issued to Mertol, and U.S. Pat. No. 5,430,610 for *SEPARABLE POSITIONING DEVICE FOR THE HEAT SINK ON COMPUTER CHIPS* issued to Hung.

While these recent efforts provide advantages, I note that they fail to adequately provide a method for efficiently and conveniently attaching a heat sink.

SUMMARY OF THE INVENTION

It is an object of the present invention to provide a device for readily attaching and detaching a heat sink to or from an electronic device generating heat.

It is another object of the present invention to provide a device which makes the heat sink tightly contact the semiconductor module.

According to an aspect of the present invention, a device for attaching a heat sink having a first and a second surface to an element generating heat in an electronic system, which element has an upper plane side contacting the first surface of the heat sink and a lower connector side connected to a printed circuit board, comprises a pair of holes formed on the upper plane side of the element at both sides of the heat sink attached to the element, a clip attached to the second surface of the heat sink having two hooked ends respectively connected with the pair of holes, a lever hinged to the clip, and a support hinged to the lever, wherein the lever is swung so as to cause the support to press or release the heat sink against or from the element. Preferably, the clip has a lever holding seat to hold a first fixing lug formed on the lever swung to cause the support to press the heat sink, thereby preventing the lever from inadvertent reverse swing. In addition, the clip may have a stopper to limit the swing of the lever for releasing the heat sink from the element, and the lever has additionally a second fixing lug resiliently fixed onto the lever swung to release the heat sink from the element.

To achieve these and other objects in accordance with the principles of the present invention, as embodied and broadly described, the present invention provides an apparatus, comprising: a heat sink having a first surface and a second surface; an element generating heat, forming two apertures at a first side of said element, said first side of said element contacting said first surface of said heat sink; a fastening unit being attached to said second surface of said heat sink, said fastening unit including two hooks, each one of said two hooks being received into a respective one of said two apertures; a lever being hingedly attached to said fastening unit, said lever being movable between a first position and a second position; and a support unit being hingedly attached to said lever, said support unit contacting said second surface of said heat sink, said lever in said first position forcing said support unit to press said heat sink against said element, said lever in said second position not forcing said support unit to press said heat sink against said element.

To achieve these and other objects in accordance with the principles of the present invention, as embodied and broadly described, the present invention provides an apparatus, comprising: a heat sink having a first surface and a second surface; an element generating heat, having a first side, and forming two apertures at said first side of said element, said first side of said element contacting said first surface of said heat sink; a clamp being attached to said second surface of said heat sink, said clamp including two hooks, each one of said two hooks being received into a respective one of said two apertures; and a lever being hingedly attached to said clamp, said lever being movable between a first position and a second position, said lever contacting said second surface of said heat sink, said lever in said first position pressing said heat sink against said element, said lever in said second position not-pressing said heat sink against said element.

To achieve these and other objects in accordance with the principles of the present invention, as embodied and broadly described, the present invention provides a method, comprising: forming two apertures at a first side of an element, said element generating heat; attaching a clip to a first surface of a heat sink, said clip including two hooks, each one of said two hooks being received into a respective one of said two apertures, said first side of said element contacting a second surface of said heat sink; hingedly attaching a lever to said clip, said lever being movable between a first position and a second position; and hingedly attaching a support unit to said lever, said support unit contacting said first surface of said heat sink, said lever in said first position forcing said support unit to press said heat sink against said element, said lever in said second position not forcing said support unit to press said heat sink against said element.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
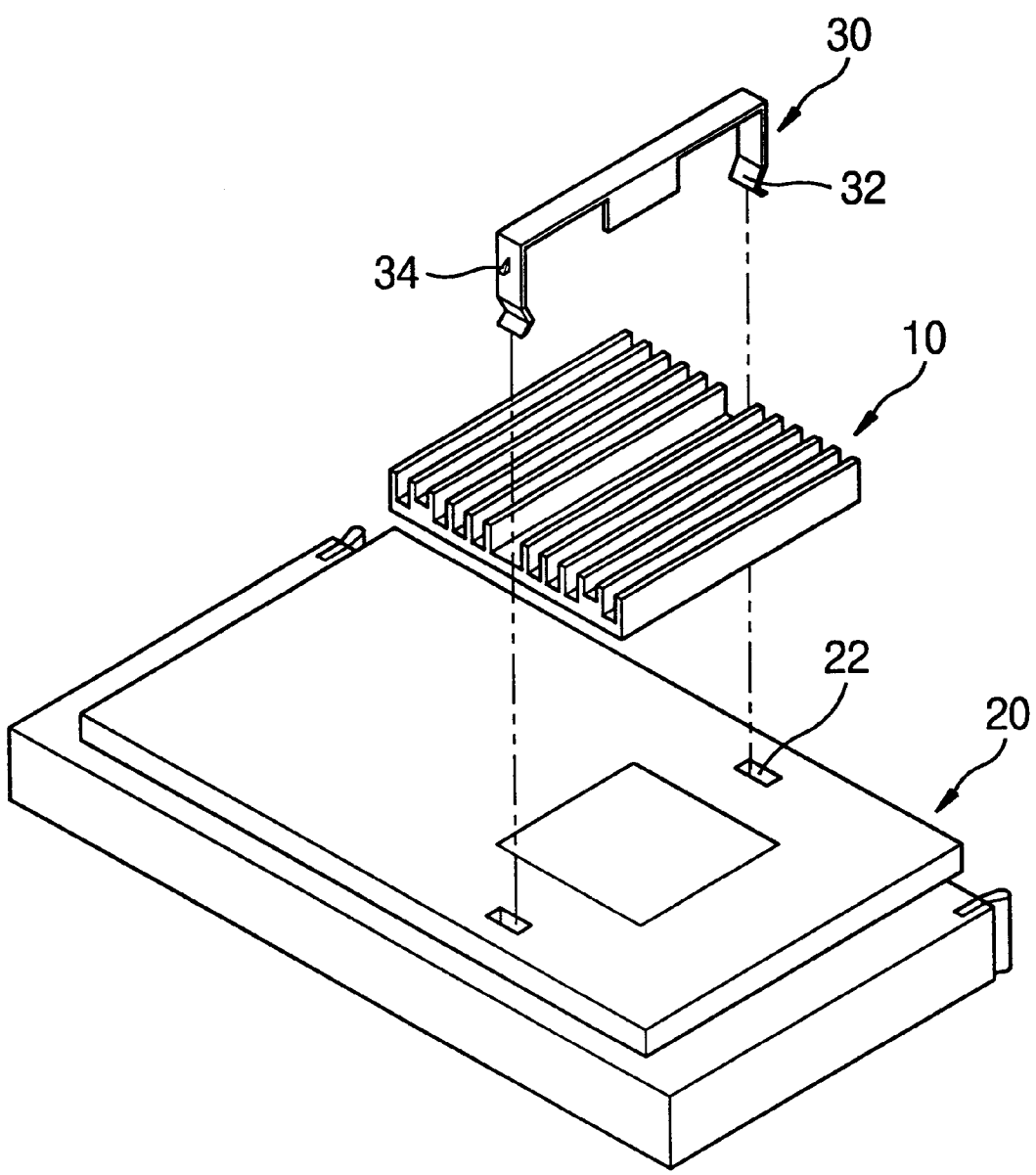
FIG. 1 is a perspective view for illustrating a clip to attach a heat sink to a semiconductor module.
Figure 2:
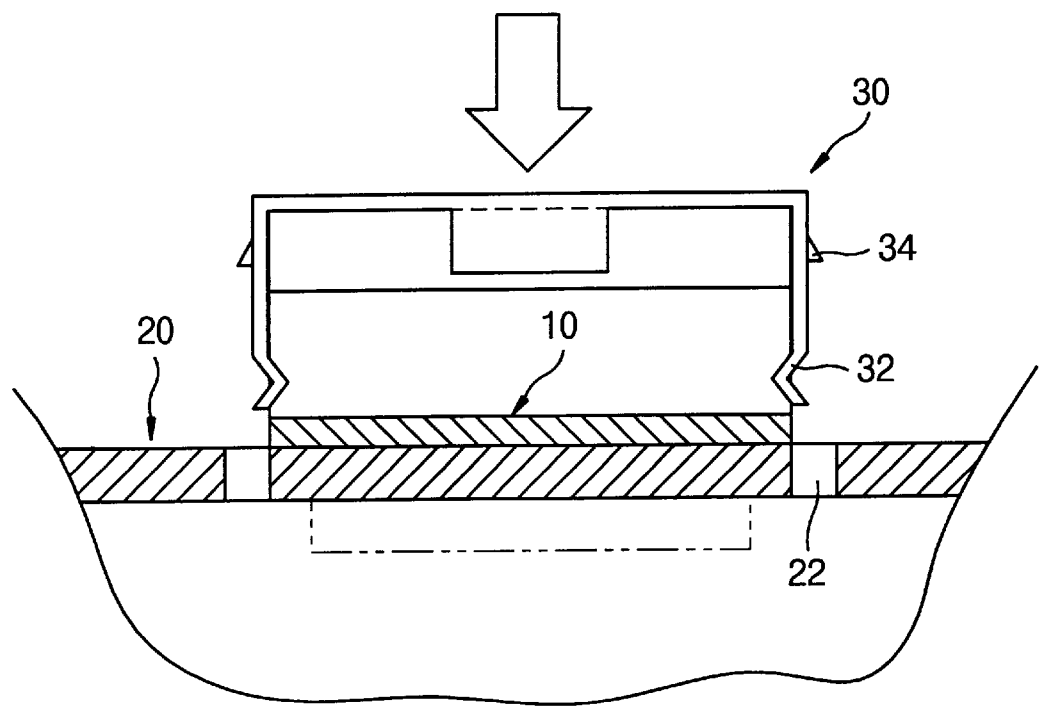
FIG. 2 shows cross sections for illustrating the process of attaching the heat sink to the semiconductor module by using the clip as shown in FIG. 1.
Figure 2:
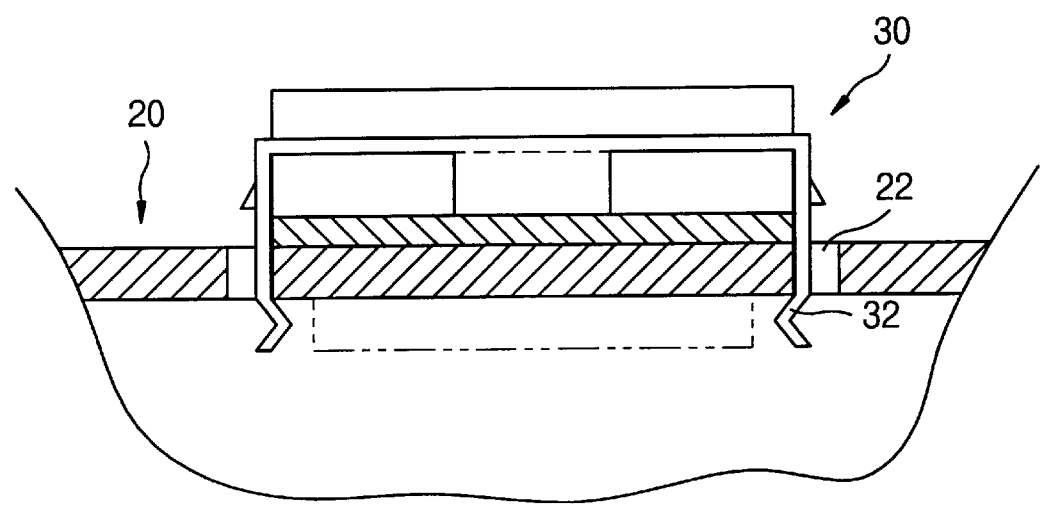

Referring to FIG. 1, a heat sink 10 is attached to a semiconductor module 20 by means of a clip 30. To this end, a plurality of holes 22 are formed on the upper side of the semiconductor module 20 while both ends of the clip 30 is provided with latches 32 held by the holes. Firstly, after placing the heat sink 10 over the semiconductor module 20, the clip 30 is positioned over the heat sink 10 with the latches 32 facing the respective holes 22 of the semiconductor module 20, as shown in the cross sectional view of FIG. 2. Then, pushing the clip 30 towards the heat sink 10, the latches 32 are tightly inserted into the holes 22 to fixedly attach the heat sink 10 to the semiconductor module 20. On the contrary, in order to remove the heat sink 10 from the semiconductor module 20, the latches 32 are slightly spread by using a detaching tool such as a sharp pole inserted into a lug 34 formed on the clip 30 so as to be pulled out of the holes 22. Then, pulling the clip 30 upwards, the heat sink 10 may be detached from the semiconductor module 20.

As described above, such clip 30 fixes the heat sink 10 on the semiconductor module by means of its resilience, suffering the following drawbacks:

Firstly, a considerable force should be exerted to the clip 30 when attaching or detaching it to or from the semiconductor module 20. Moreover, the detaching tool is required for the detaching of the clip 30 from the semiconductor module 20. Secondly, the clamping force of the clip 30 is so weak that the thermal conductivity between the heat sink 10 and the semiconductor module 20 is inadequate, and that the heat sink 10 may be inadvertently detached from the semiconductor module 20 by a small external impact.

Throughout the attached drawings are used the same reference numerals to represent the same functional parts. The inventive device may be preferably used to attach a heat sink to a microprocessor such as Intel Pentium II.

Figure 3:
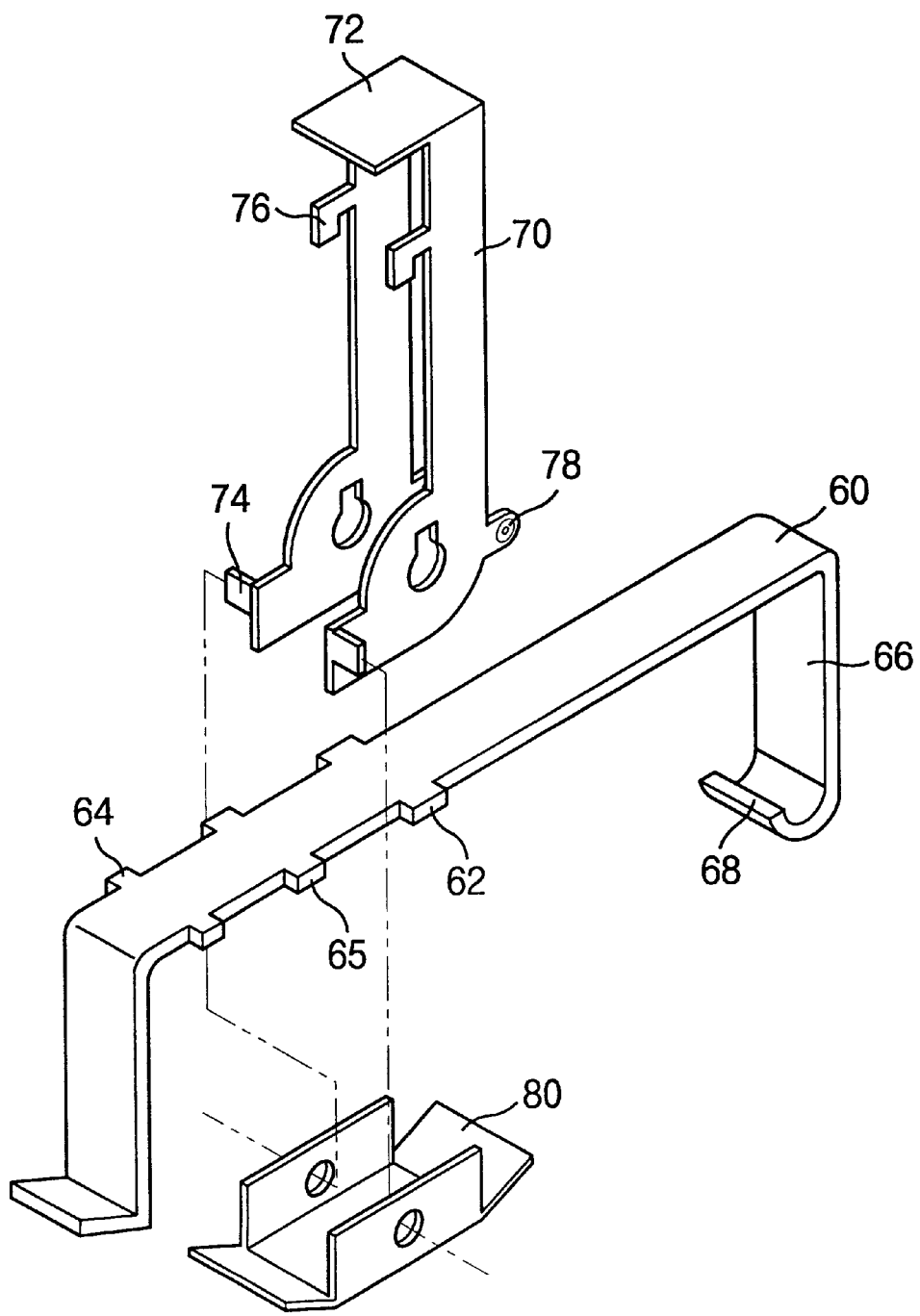
FIG. 3 is an exploded perspective view for illustrating the device for detachably attaching a heat sink to a semiconductor module, in accordance with the principles of the present invention.
Figure 4:
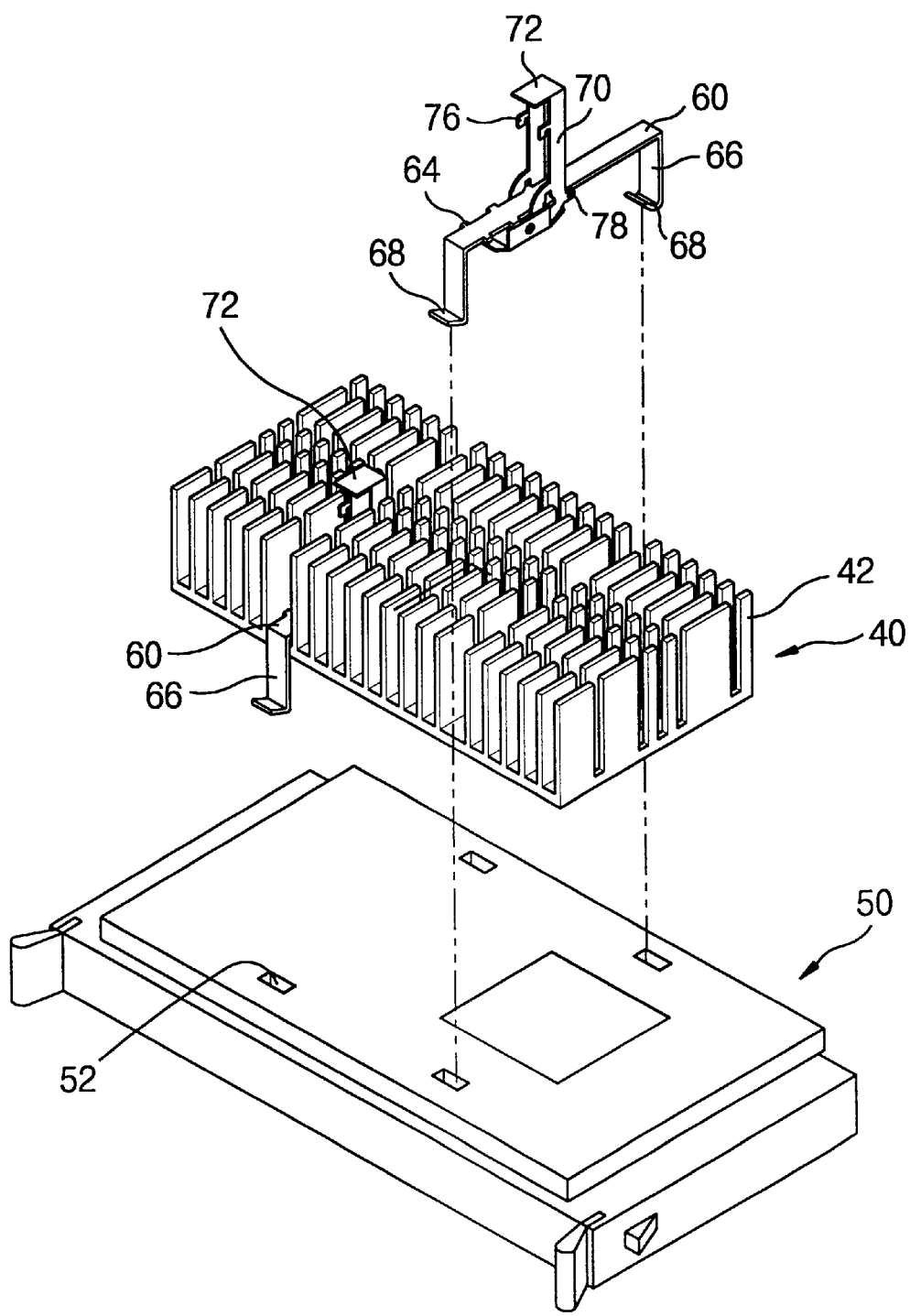
FIG. 4 is a perspective view for illustrating the process of attaching a heat sink to a semiconductor module by means of the inventive device of FIG. 3, in accordance with the principles of the present invention.

Referring to FIGS. 3 and 4, a semiconductor module 50 has an upper plane side contacting a heat sink 40 and a lower connector side connected to a printed circuit board. The upper plane side is provided with holes, which are positioned along two sides of the heat sink 40 mounted on the semiconductor module 50. The heat sink 40 is preferably made of a material having good thermal conductivity such as aluminum. The heat sink 40 has a first surface contacting the upper plane side of the semiconductor module 50 and a second surface formed with a plurality of heat radiating fins 42. A clip 60 is mounted on the second surface of the heat sink 40.

Figure 5A:
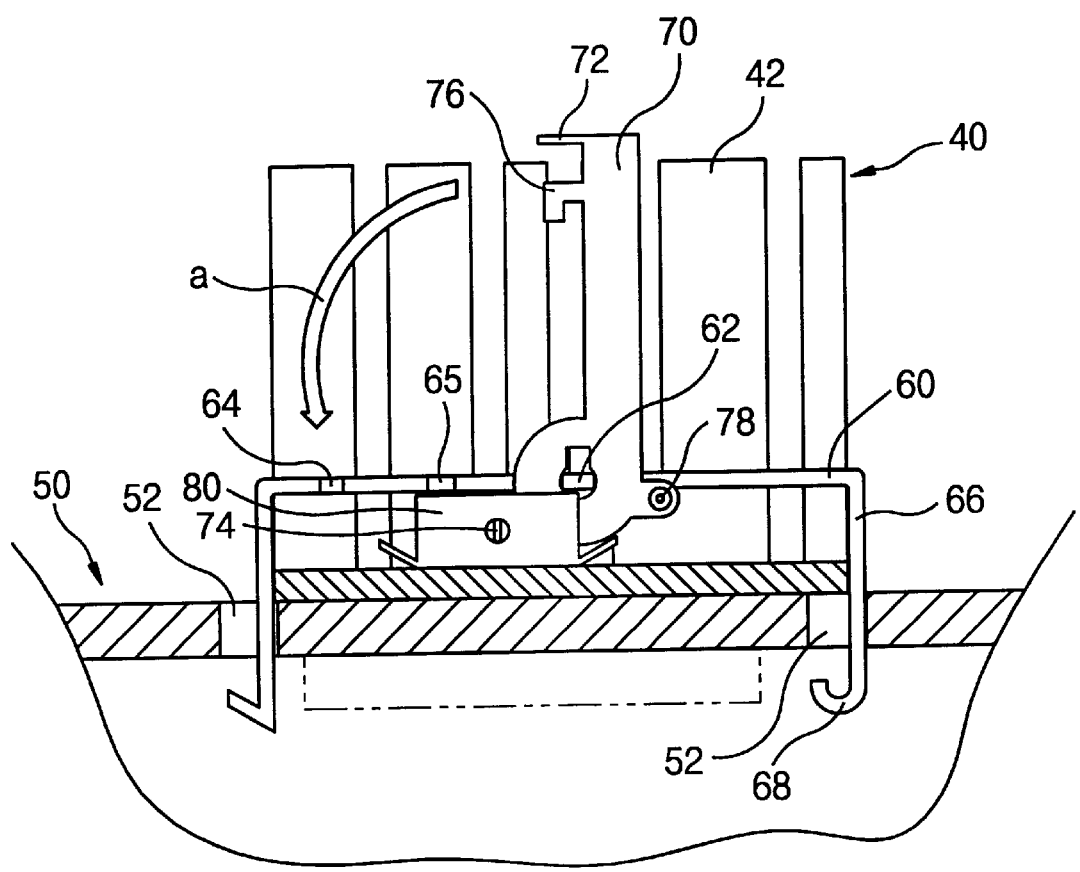
FIGS. 5A to 5C are cross sectional views for illustrating the sequential steps of attaching a heat sink to a semiconductor module by using the inventive device, in accordance with the principles of the present invention.
Figure 5B:
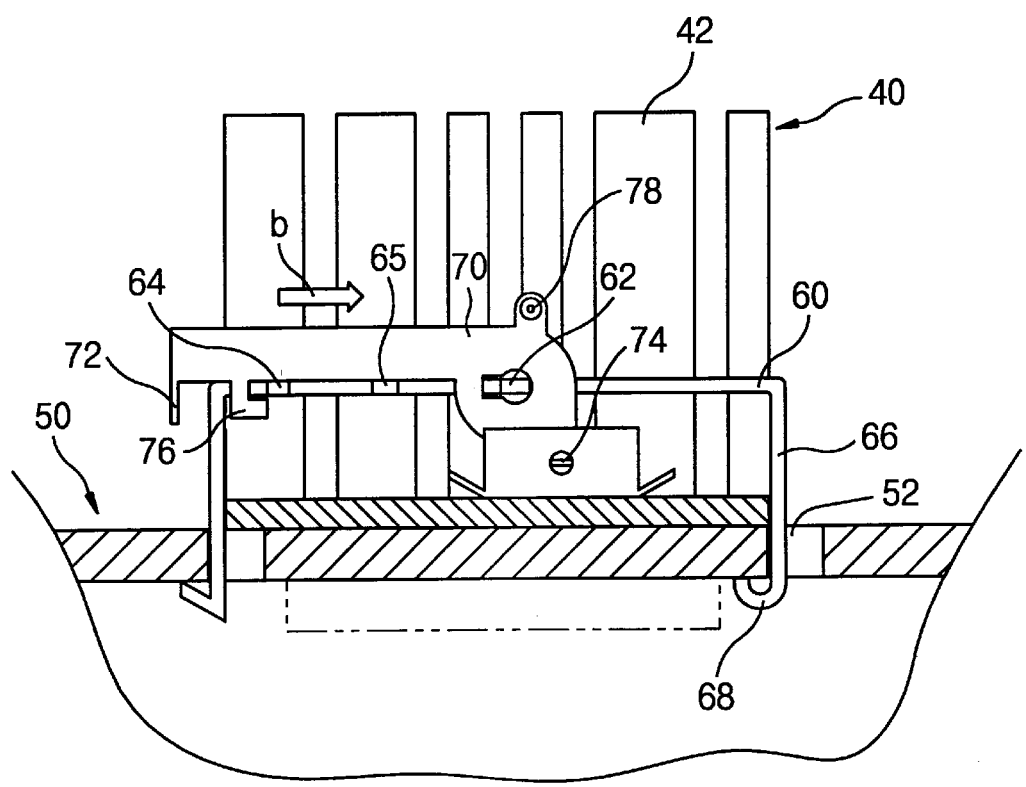

Describing the inventive device for attaching the heat sink to the semiconductor module with reference to FIG. 3, it comprises the clip 60, a lever 70, and support 80. The clip 60 includes first hinge lugs 62, lever holding seats 64, and stoppers 65. The clip 60 has both ends 66 vertically bent with hooks 68 respectively connected with the holes 52. The stoppers 65 are to limit the movement of the lever 70 which is swung to detach the heat sink 40 from the semiconductor module. The lever 70 is hinged on the clip 60 by the first hinge lugs 62 associated with one end of the lever 70, whose other end is provided with a handle 72 to enable the user to easily operate the lever. The lever 70 is additionally provided with first and second fixing lugs 76 and 78. The first fixing lugs 76 are respectively held by the lever holding seats 64 when the lever 70 is swung to lock the support 80 to press the heat sink 40 against the semiconductor module 50, as shown in FIG. 5B. The second fixing lugs 78 are resiliently held by the clip 60 in order to properly limit the movement of the lever 70 when it is swung to release the support 80 and thus the heat sink 40 from the semiconductor module 50, as shown in FIG. 5A. The support 80 is hinged on second hinge lugs 74 of the lever 70, so that the support 80 attaches or detaches the heat sink 40 to or from the semiconductor module 50 by swinging the lever 70.

Figure 5C:
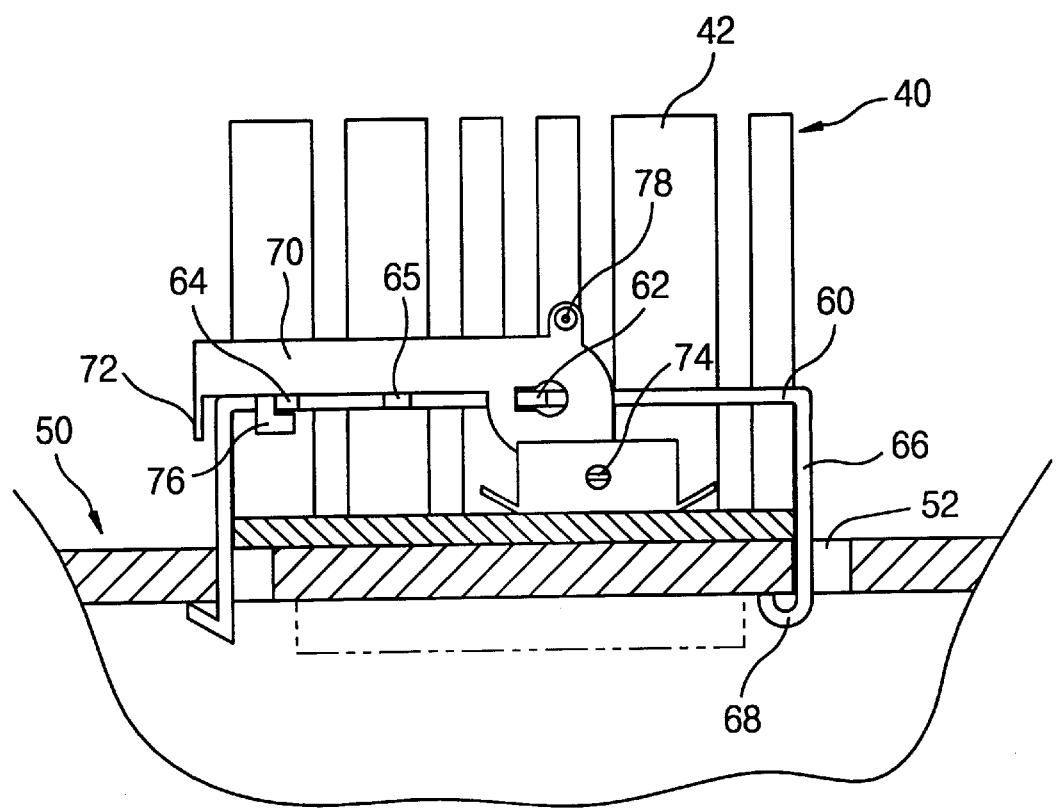
Figure 6:
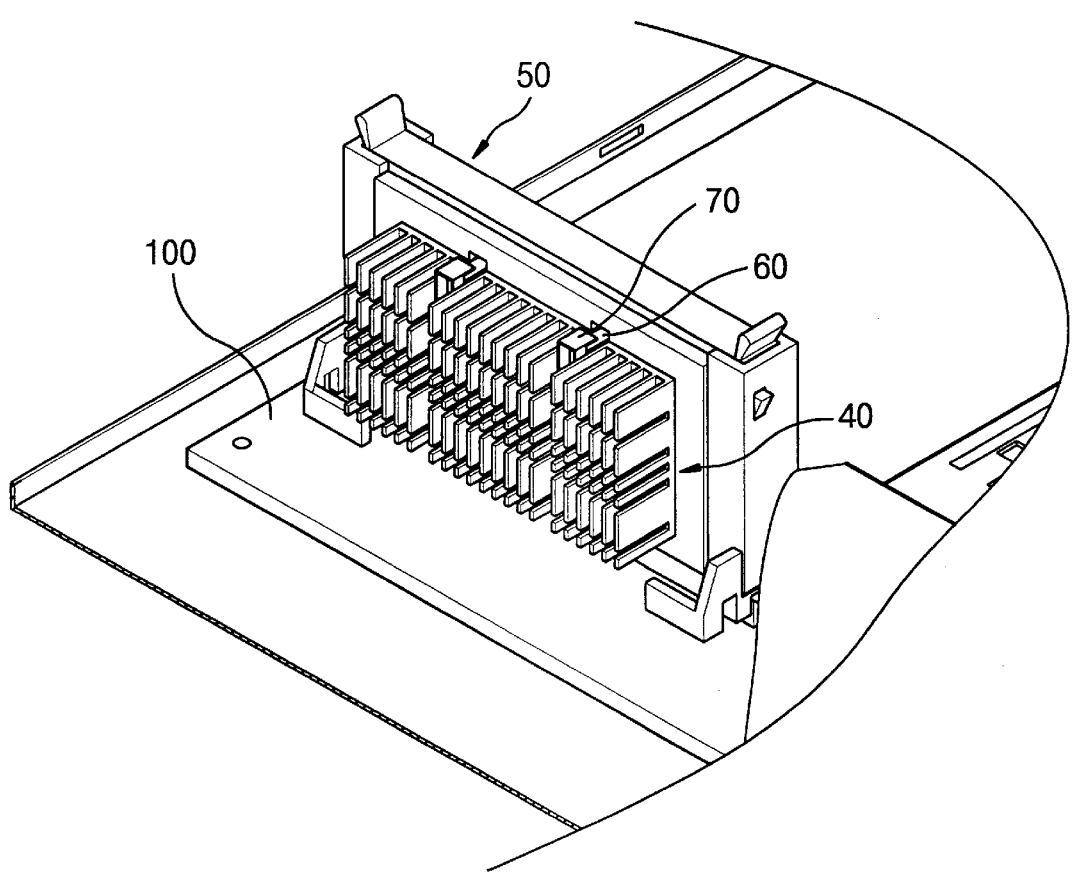
FIG. 6 is a perspective view for illustrating a printed circuit board mounted with a semiconductor module to which a heat sink is attached by means of the inventive device, in accordance with the principles of the present invention.

Hereinafter will be described the sequential steps of attaching the heat sink to the semiconductor module with reference to FIGS. 5A to 5C. First placing the heat sink 40 on the upper plane surface of the semiconductor module 50, the clip 60 is positioned over the heat sink with the hooks 68 respectively inserted in the holes 52, as shown in FIG. 5A. In this case, the lever 70 takes preferably the vertical position. When the lever 70 is swung in the locked direction "a" by means of the handle 72, the support 80 descends downwards to press the second surface of the heat sink 40 against the semiconductor module. FIG. 5B shows that the lever is completely swung towards the locked direction to press the heat sink 40 against the semiconductor module. The heat sink 40 is tightly contacted with the upper plane surface of the semiconductor module 50. Finally, the lever 70 is slightly pushed towards the direction of arrow "b" as shown in FIG. 5B to keep the lever 70 in that locked position. This is achieved with the first fixing lugs 76 held by the lever holding seats 64, as shown in FIG. 5C. There is shown in FIG. 6 the heat sink 40 fastened with the semiconductor module 50 mounted on the printed circuit board 100. The printed circuit board 100 can be a computer's main board or a computer's mother board, for example.

On the contrary, detaching the heat sink 40 from the semiconductor module 50, the first fixing lugs 76 are firstly separated from the lever holding seats 64 by moving the lever 70 towards the opposite direction to that of arrow "b" shown in FIG. 5B. Then, the lever 70 is swung to the released position so that the support 80 rises upwards detached from the second surface of the heat sink 40. Thus, the clip 60 may be removed from the semiconductor module 50. Of course, the inventive device may be applied to all kinds of electronic devices requiring the heat dissipation in an electronic system.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:
    a heat sink having a first surface and a second surface;
    an element generating heat, forming two apertures at a first side of said element, said first side of said element contacting said first surface of said heat sink;
    a fastening unit being attached to said second surface of said heat sink, said fastening unit including two hooks, each one of said two hooks being received into a respective one of said two apertures;
    a lever being hingedly attached to said fastening unit, said lever being movable between a first position and a second position; and
    a support unit being hingedly attached to said lever, said support unit contacting said second surface of said heat sink, said lever in said first position forcing said support unit to press said heat sink against said element, said lever in said second position not forcing said support unit to press said heat sink against said element.

2. The apparatus of claim 1, said heat sink further comprising a first side edge and a second side edge, said two apertures being formed at said first side of said element at positions adjacent to said first and second side edges of said heat sink.

3. The apparatus of claim 1, said element further comprising a second side connected to a printed circuit board.

4. The apparatus of claim 1, said fastening unit corresponding to a clip.

5. The apparatus of claim 1, further comprising said two hooks being received by said two apertures and hooking onto said element to pull said element toward said heat sink when said lever is in said first position, said two hooks not hooking onto said element when said lever is in said second position.

6. The apparatus of claim 1, further comprising:
    a first protrusion being formed on said fastening unit; and
    a first lug being formed on said lever, said first lug engaging said first protrusion when said lever is in said first position and preventing said lever from moving out of said first position.

7. The apparatus of claim 1, further comprising a stopper unit being mounted on said fastening unit and limiting movement of said lever when said lever is moved from said second position toward said first position.

8. The apparatus of claim 1, further comprising a second lug being held by said fastening unit to limit movement of said lever when said lever is in said second position.

9. The apparatus of claim 8, further comprising said second lug being resiliently held by said fastening unit.

10. The apparatus of claim 1, further comprising a second lug being mounted on said lever to limit movement of said lever when said lever is in said second position.

11. The apparatus of claim 1, said heat sink further comprising a plurality of fins being located at said second surface of said heat sink, said plurality of fins radiating heat away from said element.

12. An apparatus, comprising:
    a heat sink having a first surface and a second surface;
    a clamp being attached to said second surface of said heat sink, said clamp including two hooks, each of said two hooks being received into corresponding apertures of an element positioned below said first surface;
    a lever being hingedly attached to said clamp, said lever being movable between a first position and a second position; and
    a support unit being rotatably attached to said lever, said support unit contacting said second surface of said heat sink, said lever in said first position forcing said support unit to press said heat sink against said element, said lever in said second position not forcing said support unit to press said heat sink against said element.

13. The apparatus of claim 12, said heat sink further comprising a first side edge and a second side edge, said two apertures being formed at said first side of said element at positions adjacent to said first and second side edges of said heat sink.

14. The apparatus of claim 13, said element further comprising a second side connected to a printed circuit board.

15. The apparatus of claim 14, further comprising said two hooks being received by said apertures and grasping the element toward said heat sink when said lever is in said first position, said two hooks not grasping the element when said lever is in said second position.

16. The apparatus of claim 15, further comprising:
    a first protrusion being formed on said clamp; and
    a first lug being formed on said lever, said first lug engaging said first protrusion when said lever is in said first position, said first lug locking said lever in said first position.

17. The apparatus of claim 16, further comprising a stopper unit being mounted on said clamp and limiting movement of said lever when said lever is moved from said second position toward said first position.

18. A method, comprising:

forming two apertures at a first side of an element, said element generating heat;

attaching a clip to a first surface of a heat sink, said clip including two hooks, each one of said two hooks being received into a respective one of said two apertures, said first side of said element contacting a second surface of said heat sink;

hingedly attaching a lever to said clip, said lever being movable between a first position and a second position; and hingedly attaching a support unit to said lever, said support unit contacting said first surface of said heat sink, said lever in said first position forcing said support unit to press said heat sink against said element, said lever in said second position not forcing said support unit to press said heat sink against said element.

19. The method of claim 18, further comprising connecting said element to a printed circuit board.

20. The method of claim 18, further comprising:

forming at least one protrusion on said clip; and forming at least one lug on said lever, said at least one lug engaging said at least one protrusion when said lever is in said first position, said at least one lug preventing said lever from moving out of said first position when said lever is in said first position.

* * * * *